United States Patent [19]

Kosugi et al.

[11] Patent Number: 5,723,383
[45] Date of Patent: Mar. 3, 1998

[54] SEMICONDUCTOR SUBSTRATE TREATMENT METHOD

[75] Inventors: Toshihiko Kosugi; Hiromu Ishii; Yoshinobu Arita, all of Kanagawa, Japan

[73] Assignee: Nippon Telegraph and Telephone Corporation, Japan

[21] Appl. No.: 407,416

[22] Filed: Mar. 17, 1995

[30] Foreign Application Priority Data

Mar. 25, 1994 [JP] Japan .................................. 6-077927
Oct. 17, 1994 [JP] Japan .................................. 6-250855

[51] Int. Cl.$^6$ .................................................. H01L 21/00
[52] U.S. Cl. ........................ 438/719; 438/694; 438/710; 438/475; 427/535; 427/539
[58] Field of Search ................. 204/192.15, 192.17; 437/192, 937, 228, 238; 427/253, 535, 539; 216/17, 18, 109; 156/644.1

[56] References Cited

U.S. PATENT DOCUMENTS 4,960,732 10/1990 Dixit et al. .......................... 437/192
5,281,546 1/1994 Possin et al. ........................ 437/40

OTHER PUBLICATIONS

Chih-Tang Sah, Jack Yuan-Chen Sun and Joseph Jeng-Tao Tzou, "Deactivation of the boron acceptor in silicon by hydrogen", Appl. Phys. Lett. 43 (2), 15 Jul. 1983.

S.J. Pearton, Michael Stavola and J.W. Corbett, "Configurations and Properties of Hydrogen in Crystalline Semiconductors", Materials Science Forum vols. 38–41 (1989) pp. 25–37.

S.J. Pearton and J. Lopata, "Dissociation of P–H, As–H, and Sb–H complexes in n-type Si", Appl. Phys. Lett. 59 (22), 25 Nov. 1991, pp. 2841-2483.

R.A. Levy and M.L. Green, "Low Pressure Chemical Vapor Deposition of Tungsten and Aluminum for VLSI Applications", Journal of the Electrochemical Society Reviews and News, Feb. 1987, pp. 37C–49C.

*Primary Examiner*—R. Bruce Breneman
*Assistant Examiner*—Luz Alejandro
*Attorney, Agent, or Firm*—Blakely Sokoloff Taylor & Zafman

[57] ABSTRACT

According to a semiconductor substrate treatment method, a surface or vicinity of a semiconductor substrate is deactivated by exposing the semiconductor substrate to a plasma atmosphere in which a gas containing at least hydrogen atoms is excited. A treatment is performed on the deactivated substrate surface. The treated substrate surface is activated by heating the semiconductor substrate.

12 Claims, 6 Drawing Sheets

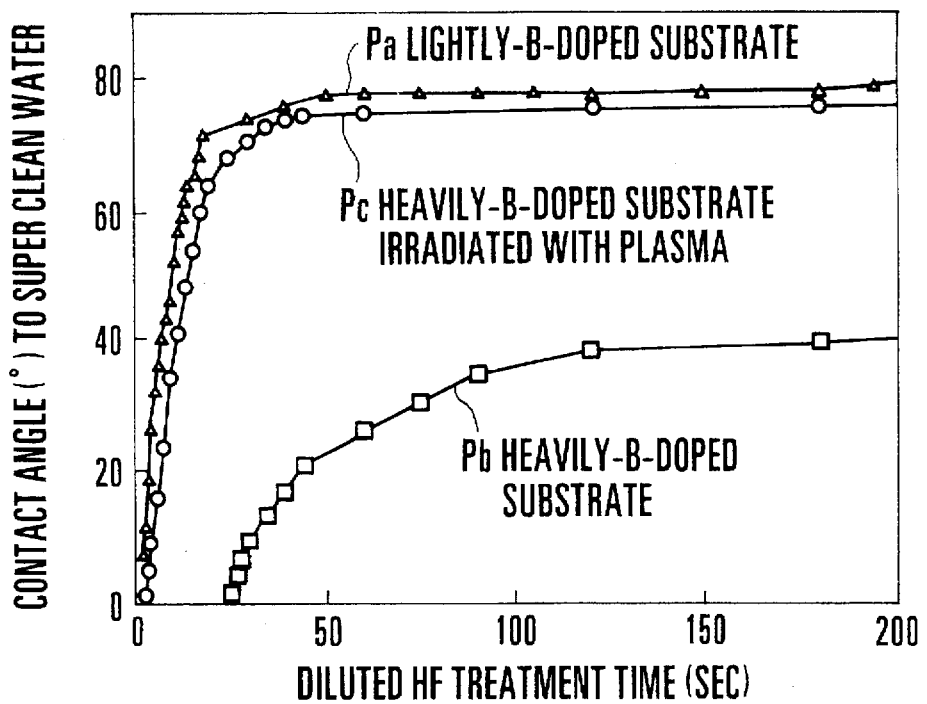
F I G. 1A
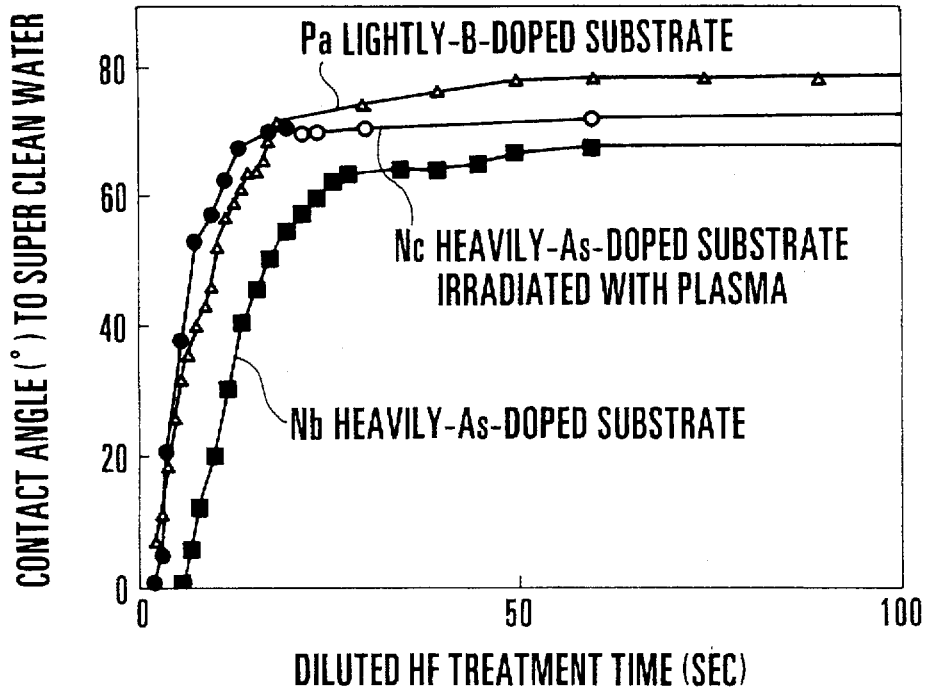
F I G. 1B

SEMICONDUCTOR SUBSTRATE TREATMENT METHOD

BACKGROUND OF THE INVENTION

The present invention relates to a semiconductor substrate treatment method.

In forming a low-resistance ohmic contact, a surface treatment for a heavily-doped silicon (Si) substrate (in which the impurity concentration is approximately $1\times10^{20}/cm^3$) prior to growing a metal is very important. Possible factors which increase the contact resistance in opening the contact are deposition of a fluorocarbon layer, formation of a sub-oxide layer, and introduction of crystal defects to the Si substrate. Possible factors which increase the contact resistance after a hydrofluoric acid-based wet treatment are residual fluorine and regrowth of a native oxide film. To remove these deposits and altered layers, the common approach is to perform a surface treatment, such as ashing or chemical dry etching, in the pre-treatment step. Additionally, in the final step before metal growth, removal of the native oxide film using a hydrofluoric acid-based treatment solution or formation of a hydrogen-terminated surface is performed to reduce contamination caused by transport in air.

It is, however, known to those skilled in the art that a heavily-doped semiconductor substrate used for a metal contact is different from a lightly-doped semiconductor substrate in the cleaning characteristics, the etching characteristics, and the reaction characteristics between the source gas and the substrate during metal growth. In the case of lightly-doped substrates, the difference in these characteristics between p-type and n-type substrates is too small to be a practical problem. However, in the case of heavily-doped substrates, the reactivity changes significantly in accordance with the substrate type. Therefore, it is sometimes necessary to employ processing conditions with an exceedingly small process margin. One conventional example of each of these processing methods will be described below.

To obtain a hydrogen-terminated, clean Si surface prior to processing such as formation of a metal film on an Si substrate, cleaning using a diluted HF solution or a buffered diluted HF solution is performed in many cases. This cleaning method is of great utility value since the method is simple and the resultant hydrogen-terminated surface is stable even in air.

To obtain a nearly perfect hydrogen-termination on the surface of a heavily-doped substrate, however, the treatment must be done in the above-mentioned solution for an extremely long period of time. This tendency is especially typical in p-type heavily-doped substrates and not found in undoped or lightly-doped semiconductor substrates. As an example, in a p-type Si substrate with an impurity concentration of about $1\times10^{18}/cm^3$, it is readily possible to obtain a hydrogen-terminated surface which is stable for long time periods even in air, as well as in substrates having lower impurity concentrations than that.

Note that when the surface of a heavily-doped substrate is well treated in the solution described above, a dielectric layer which also exists on the substrate surface largely decreases and the pattern edge withdraws. These are problems in the micro fabrication of semiconductor devices. If, however, the treatment time in the solution is shortened in order that the change in the shape of the dielectric layer or the like falls within the allowable range, the surface of the heavily-doped substrate is cleaned only unsatisfactorily. This leads to degradation in the contact characteristics or the adhesion with respect to the metal film grown on the substrate. To obtain a clean surface by short-time cleaning, the cleaning is sometimes done by using a buffered diluted HF solution whose cleaning efficiency is increased compared to that of a simple diluted HF solution or by using a buffered diluted HF solution containing a commercially available surface active agent. It is unfortunate that the effects of these solutions are still unsatisfactory. Furthermore, fluorine tends to remain on the surface of a p-type heavily-doped substrate although the cleaning time is prolonged, so it is basically impossible to obtain an ideal hydrogen-terminated surface.

Etching of the surface of a heavily-doped substrate will be described next. Processing of a poly Si gate used in an Si-MOSLSI (dual-gate CMOS technology) having a heteropolar gate structure requires constant-rate etching of amorphous Si or poly Si which is heavily doped with a p- or n-type dopant. In practice, however, it is in some cases difficult to find out such constant-rate etching conditions. Therefore, in the present situation, this problem is avoided by increasing the number of steps and making some improvement in a process except for the etching. For example, there is provided a step by which a thin B-doped poly Si layer whose etching rate is lower than that of a P-doped poly Si layer is formed before the etching step. Alternatively, over-etching is sufficiently done by using $SiO_2$ as a stopping layer. Unfortunately, these methods lead to an increase in the number of steps or degradation in the crystallinity of the underlaying substrate.

Finally, growth of a metal film on an Si substrate will be described. As a specific metal film growth method, a method has been attempted in which surface cleaning of a heavily-doped Si substrate is involved in the growth method to compensate for the imperfection of the hydrofluoric acid-based wet treatment described above, thereby improving the contact characteristics. As one example, selective tungsten (W) CVD using tungsten hexafluoride ($WF_6$) will be described below.

A conventional selective growth technique by which W is grown only in a desired region on an Si substrate is done by using the following two methods. One is an Si reduction method in which W is grown by reducing $WF_6$ as a source gas by using the underlying Si (this reduction will be referred to as an Si reduction reaction hereinafter). The other is an $SiH_4$ reduction method in which W is grown by supplying silane ($SiH_4$) together with $WF_6$ and reducing $WF_6$ with this $SiH_4$ (this reduction will be referred to as an $SiH_4$ reduction reaction hereinafter). That is, in this conventional method, W is grown by successively performing these two types of methods.

In the Si reduction method, $WF_6$ and the underlying Si directly react with each other to grow W and at the same time reaction consumption of the Si substrate (to be referred to as Si consumption hereinafter) takes place. Consequently, removal of a surface contamination layer and an altered layer is done (this removal will be referred to as self-cleaning hereinafter). For this reason, a low-resistance ohmic contact can be easily obtained even with the imperfection of the hydrofluoric acid-based wet treatment.

In the Si reduction method, however, the underlying Si substrate is consumed excessively (that is, the underlying substrate is etched, and the W layer cuts into the etched portion).

In addition, in the Si reduction reaction, the start of the reaction is delayed a certain time (to be referred to as an incubation period hereinafter) if surface contamination exists. This incubation period is very long in an imperfectly cleaned p-type heavily-doped substrate as compared with an n-type heavily-doped substrate. In a semiconductor device which has both p- and n-type silicon on it, therefore, a large Si consumption occurs in the n-type heavily-doped substrate if the Si reduction is done until the p-type heavily-doped substrate is cleaned. At present, the thickness of the active layer of an Si device is very small in order to improve the performance of the device. Therefore, the Si consumption which deteriorates the device characteristics is not negligible in growing a metal on a heavily-doped active layer.

The Si consumption as described above can be eliminated by switching to the $SiH_4$ reduction method at an early stage. In the $SiH_4$ reduction method, the direct reaction between Si and $WF_6$ is discouraged because a gas which is reducible to $WF_6$ is actively introduced. Consequently, the Si consumption in the $SiH_4$ method is smaller than that in the Si reduction method. However, if growth is done by the $SiH_4$ reduction method from the beginning, although the Si consumption amount is small, self-cleaning becomes imperfect since the Si reduction reaction is discouraged as described above. As a result, not only good contact characteristics cannot be obtained by a p-type heavily-doped substrate, but, in many instances, W is not deposited or peeled even though once deposited.

To form a good metal contact, therefore, it is necessary to combine the above two types of growth methods. It is unfortunate that under conditions by which contacts can be formed at a high yield by the use of these growth methods, the total Si consumption amount is at least $4 \times 10^{-8}$ m for an n-type heavily-doped substrate and $3 \times 10^{-8}$ m for a p-type heavily-doped substrate. This makes it essentially impossible to employ these methods in the fabrication of shallow junction devices.

As described above, even in the metal film growth method making use of the method of surface cleaning, surface cleaning of a heavily-doped Si substrate, and particularly a p-type heavily-doped substrate before the growth are essential. This brings about the problem that good contacts are difficult to form with the cleaning characteristics achieved by a commonly used hydrofluoric acid-based treatment solution.

An electrical deactivation method using hydrogen will be described next. This electrical deactivation method using hydrogen is conventionally known, in which electrical deactivation is performed by exposing a semiconductor substrate to a hydrogen plasma atmosphere.

To electrically deactivate 90% or more of the impurity state by using this method, it is experimentally known that a necessary plasma irradiation time is about 3 hours for p-type Si ("Material Science Forum", Vols. 38–41, pp. 25–38, 1989) and about 10 hours for n-type Si ("Applied Physics Letters", Vol. 59, pp. 2,841–2,843, 1991).

Unfortunately, in this electrical deactivation method using hydrogen, if a substrate is made from Si, poly Si, GaAs, or InP, etching of the substrate as illustrated in FIGS. 7A and 7B occurs simultaneously with the deactivation. That is, as in FIG. 7A, when hydrogen plasma is irradiated on a substrate 10, the substrate surface denoted by reference numeral 12 is etched as denoted by reference numeral 13. In FIG. 7B, similar etching takes place in a portion of the substrate 10 not covered with a mask 11. Consequently, a region in which the impurity state is deactivated is lost from the substrate surface. In deactivation of a doped layer formed as a thin film, for example, this etching quantity is no longer negligible with respect to the film thickness.

As has been described above, in the conventional cleaning method using a hydrofluoric-acid treatment solution, the treatment time is prolonged to sufficiently clean a heavily-doped semiconductor substrate. The results are a large decrease in a dielectric layer which also exists on the substrate surface and withdrawal of the pattern edge. If the treatment time is short, on the other hand, the surface of a heavily-doped substrate is not sufficiently cleaned. This poses a problem of deterioration in the contact characteristics or the adhesion with respect to a metal film grown on the substrate. Furthermore, fluorine tends to remain on the surface of a p-type heavily-doped substrate although the cleaning time is prolonged, so it is not possible to obtain an ideal hydrogen-terminated surface.

In the conventional etching treatment for etching heavily-doped semiconductor substrates, it is difficult to find constant-rate etching conditions because the etching rate of an n-type heavily-doped substrate is higher than that of a p-type heavily-doped substrate. Since this problem is avoided by making some improvement in a process excluding the etching, the number of steps is increased, or the crystallinity of the underlying substrate is degraded.

In the conventional reduction treatment by which a conductive layer is formed on a heavily-doped semiconductor substrate, e.g., in the reduction method such as the Si reduction method which uses the semiconductor substrate material as a reducing agent, the underlying substrate is consumed, i.e., consumption of the substrate takes place. On the other hand, in the reduction method such as the $SiH_4$ reduction in which the substrate material is not used as a reducing agent, self-cleaning is imperfect. The result is that not only good contact characteristics are not obtained by heavily-doped substrates, but the conductive layer is not deposited or peeled even though once deposited.

Also, the conventional electrical deactivation method using hydrogen has the problem that etching of the substrate occurs simultaneously with the deactivation.

SUMMARY OF THE INVENTION

It is, therefore, a principal object of the present invention to provide a semiconductor substrate treatment method capable of performing reaction control for various processing steps more appropriately than in conventional methods in processing heavily-doped semiconductor substrate.

It is another object of the present invention to provide a semiconductor substrate treatment method capable of improving the cleaning characteristics and the etching characteristics of a heavily-doped semiconductor substrate, and improving the reaction characteristics between the source gas and the substrate during metal growth.

It is still another object of the present invention to provide a semiconductor substrate treatment method capable of discouraging etching when electrical deactivation using hydrogen is performed.

It is still another object of the present invention to provide a semiconductor substrate treatment method capable of similarly controlling treatments for p- and n-type semiconductor substrates.

To achieve the above objects of the present invention, there is provided a semiconductor substrate treatment method comprising the deactivation step of deactivating a surface or vicinity of a semiconductor substrate by exposing the semiconductor substrate to a plasma atmosphere in which a gas containing at least hydrogen atoms is excited, the treatment step of performing a treatment on the substrate surface after the deactivation step, and the activation step of activating the substrate surface by heating the semiconductor substrate after the treatment step.

In this method, the treatment step done after the deactivation step includes various treatments such as cleaning and etching of the substrate surface, and growth of a metal layer. Therefore, it should be noted that two or more treatments can be involved in this treatment step. Practical treatments performed in this step will be described in detail later in the examples of the present invention.

BRIEF DESCRIPTION OF THE DRAWINGS

FIGS. 1A and 1B are graphs for explaining the effect of a semiconductor substrate treatment method according to an embodiment of the present invention, each of which shows the dependence of the contact angle to super clean water on the diluted HF solution treatment time;

DESCRIPTION OF THE PREFERRED EMBODIMENTS

Example 1

Figure 2A:
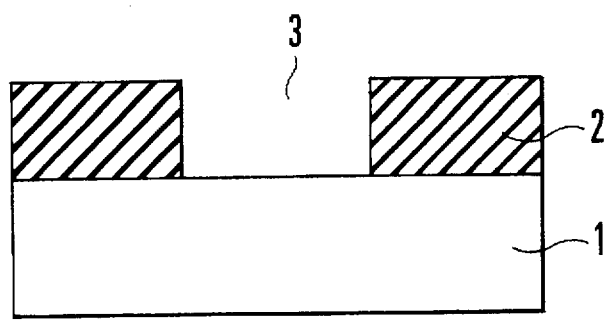
FIGS. 2A to 2C are sectional views showing a conductive layer formation method as a semiconductor substrate treatment method according to another embodiment of the present invention.

Example 1 in which the present invention was applied to cleaning of heavily-doped semiconductor substrates as an embodiment of the present invention will be described below.

FIGS. 1A and 1B are graphs for explaining the effect of this example, each of which shows the dependence of the contact angle to super clean water on the diluted HF solution treatment time.

In FIG. 1A, reference symbol Pa denotes a characteristic curve of a lightly-B-doped Si substrate (to be referred to as a lightly-doped p-type Si substrate hereinafter) with a carrier concentration of $2\times10^{15}/cm^3$; Pb, a characteristic curve of a heavily-B-doped Si substrate (to be referred to as a heavily-doped p-type Si substrate hereinafter) with a carrier concentration of $2\times10^{20}/cm^3$; and Pc, a characteristic curve of a similar heavily-doped p-type Si substrate electrically deactivated by irradiation of plasma. In FIG. 1B, reference symbol Nb denotes a characteristic curve of a heavily-As-doped Si substrate (to be referred to as a, heavily-doped n-type Si substrate hereinafter) with a carrier concentration of $2\times10^{20}/cm^3$; and Nc, a characteristic curve of a similar heavily-doped n-type Si substrate electrically deactivated by irradiation of plasma.

All of the substrates shown in FIGS. 1A and 1B were cleaned with a 0.5% diluted HF solution. Note, however, that the heavily-doped p-type Si substrate denoted by Pc and the heavily-doped n-type Si substrate denoted by Nc were subjected to cleaning, as one form of the treatment of the present invention, after being deactivated by exposing, to plasma of a gas mixture of $H_2$ and $N_2$. The plasma irradiation conditions were such that the substrate temperature was 120° C., the hydrogen flow rate was 2,000 sccm ($cm^3$/min), the nitrogen flow rate was 6 sccm, the internal pressure of a reaction chamber was 0.5 Torr (mmHg), the applied RF power was 200 W, and the plasma irradiation time was 40 min. As a result of this plasma irradiation, the carrier concentration of each substrate was reduced to $2\times10^{19}/cm^3$ or less.

Note also that when the carrier concentration of the substrate was within the range of $1\times10^{14}$ to $3\times10^{20}/cm^3$, the carrier concentration in the vicinity of (up to a depth of nearly 20 nm) the surface of the substrate could be sufficiently reduced to a value below $1/10$ the initial value by treating each of the p-type and n-type substrates under the previous plasma conditions for 40 min.

In the deactivation treatment of this example, nitrogen gas was added in addition to hydrogen gas. This was done to discourage etching of the semiconductor substrate taking place simultaneously with the deactivation, as will be described in detail later in other examples. Since, therefore, the addition of nitrogen gas has no effect on the efficiency of the deactivation, nitrogen gas need not be added in situations where etching is permissible.

From the resultant characteristics shown in FIGS. 1A and 1B, it is possible to evaluate the degree of surface cleaning using the diluted HF solution. The reasons for this will be explained below.

On the surface of a lightly-doped Si substrate, as the treatment time in a diluted HF solution increases, the hydrogen termination approaches perfection and the contact angle to super clean water increases. When the treatment time is long enough, the contact angle becomes about 80° for both p and n-type substrates.

A surface in this state is said to be a cleaned surface. On a substrate surface in this state, only small amounts of oxygen and carbon are detected except for hydrogen. In addition, the dependence of the contact angle on the diluted HF solution treatment time is also intrinsic. Therefore, by using the contact angle to super clean water, it is possible to evaluate the degree of surface cleaning.

It is evident from the curves Pc and Nc in FIGS. 1A and 1B that the heavily-doped p-type and n-type Si substrates of electrically deactivated by plasma irradiation exhibit the contact angle characteristics very close to that of the lightly-doped Si substrate. This indicates that formation of the hydrogen-terminated surface using the diluted HF solution was facilitated in comparison to the heavily-doped Si substrates not deactivated. Note that only a p-type substrate was used as the lightly-doped Si substrate because there is no difference in the characteristics between lightly-doped p-type and n-type substrates.

Also, the surface compositions of these heavily-doped Si substrates electrically deactivated were exactly the same as the surface composition of the lightly-doped Si substrate except that only small amounts of oxygen and carbon excluding hydrogen were found.

As described above, it was possible to reduce the difference in the cleaning characteristics between heavily-doped p- and n-type substrates by decreasing the effective doping level (the amount of an activated dopant) of each heavily-doped semiconductor substrate to the same level as that of a lightly-doped substrate by electrical deactivation using plasma irradiation, thereby making the processing characteristics of the heavily-doped substrate analogous to those of the lightly-doped substrate.

In this example, the diluted HF solution treatment was performed. This treatment was for obtaining a so-called cleaned surface. Therefore, a similar effect can be obtained by using a buffered diluted HF solution or a BHF solution with a surface active agent.

Also, hydrogen atoms penetrating into the Si substrate was readily eliminated from the substrate upon heating. By performing a heat treatment at 200° C. or higher after the cleaning, therefore, it was possible to return the carrier concentration and the mobility of the Si substrate to their respective values before the deactivation. This made reactivation of the Si substrate feasible.

Note that in the case of B-doped Si, conventional treatment characteristics with respect to the diluted HF solution treatment started deteriorating gradually when the carrier concentration exceeded $3 \times 10^{18}/cm^3$. The treatment characteristics especially deteriorated from $2 \times 10^{19} cm^3$ to about $3 \times 10^{20}/cm^3$ which was the upper limit by which doping was possible. For this reason, the improvement in the diluted HF solution treatment characteristics obtained by the deactivation treatment of this example was typically found when the carrier concentration was $2 \times 10^{19}$ to $3 \times 10^{20}/cm^3$ (i.e., when an increase in the saturated contact angle caused by the treatment of this example was 10° to 50°). The improvement was found slightly when the carrier concentration was $3 \times 10^{18}$ to $2 \times 10^{19}/cm^3$ (an increase in the saturated contact angle was 10° or smaller), and almost no improvement was found when the carrier concentration was $3 \times 10^{18}/cm^3$.

In the case of As-doped Si, on the other hand, the dependence of the diluted HF solution treatment characteristics on the carrier concentration was originally small. Therefore, the improvement in the diluted HF solution treatment characteristics obtained by the deactivation treatment of this example was slightly found within the range of the carrier concentration from $3 \times 10^{18}$ to $3 \times 10^{20}/cm^3$ (when an increase in the saturated contact angle was 10° or smaller). Almost no improvement was found when the carrier concentration was $3 \times 10^{18}/cm^3$.

Example 2

Example 2 in which the present invention was applied to etching of heavily-doped semiconductor substrates will be described below.

In this example, plasma irradiation similar to that in Example 1 was performed for 40 min for each of a heavily-B-doped poly Si substrate (to be referred to as a heavily-doped p-type poly Si substrate hereinafter) with a carrier concentration of $3 \times 10^{20}/cm^3$ and a heavily-P-doped poly Si substrate (to be referred to as a heavily-doped n-type poly Si substrate hereinafter) with a carrier concentration of $3 \times 10^{20}/cm^3$.

By this plasma irradiation, the mean carrier concentration of both p- and n-type poly Si films with a film thickness of $3 \times 10^{-7}$ m reduced to $3 \times 10^{19}/cm^3$ or lower.

Subsequently, an etching treatment, as one form of the treatment of the present invention, using plasma of a gas mixture containing $Cl_2$, $CF_4$, $O_2$, and Ar was performed for each of these electrically deactivated substrates by using an ECR (Electron Cyclotron Resonance) plasma etching device. The etching rate was $1.5 \times 10^{-7}$ m/min for both the p- and n-type poly Si substrates.

In a conventional method by which etching was performed for heavily-doped p- and n-type poly Si substrates analogous to those described above by using the ECR plasma etching device, the etching rate was $1.3 \times 10^{-7}$ m/min for a heavily-doped p-type poly Si substrate and $1.9 \times 10^{-7}$ m/min for a heavily-doped n-type poly Si substrate.

In the conventional method, therefore, the etching rate for p-type substrates differed from that for n-type substrates. However, in this example, it was possible to reduce the difference in the etching characteristics between heavily-doped p- and n-type substrates by making the processing characteristics of the heavily-doped substrates analogous to those of lightly-doped substrates by the electrical deactivation using plasma irradiation.

The etching can be performed by using an etching gas containing at least one of fluorine-based etching gas and chlorine-based etching gas.

In addition, as in Example 1, when annealing was performed at 550° to 600° C. for 20 min after the etching, it was possible to return the carrier concentration and the mobility of poly Si to their respective values before the deactivation treatment.

In the case of B-doped poly Si, the etching rate of ECR etching started decreasing gradually when the carrier concentration exceeded $1 \times 10^{18}/cm^3$ and kept decreasing monotonously until the carrier concentration was near $3 \times 10^{20}/cm^3$ which was the upper limit by which doping was possible.

In the case of P-doped poly Si, on the other hand, the etching rate of ECR etching started increasing gradually when the carrier concentration exceeded $1 \times 10^{18}/cm^3$ and kept increasing monotonously until the carrier concentration was near $3 \times 1^{20}/cm^3$ which was the upper limit by which doping was possible.

For this reason, the improvement in the etching characteristics obtained by this example was found in a broad range of the carrier concentration from $1 \times 10^{18}$ to $3 \times 10^{20}/cm^3$.

In this example, the ECR etching device using $Cl_2$ and $CF_4$ as primary etchants was used. However, the improvement in the etching characteristics obtained by this example was derived from deactivation of the underlying Si substrate and hence does not depend on the etching apparatus or the etching gas. It is therefore readily possible to estimate that the improvement can be similarly made when another etching apparatus or another etching gas is used.

Example 3

Example 3 will be described below as a semiconductor substrate treatment method according to another embodiment of the present invention, in which the present invention was applied to formation of a conductive layer on a heavily-doped semiconductor substrate.

In this example, plasma irradiation analogous to that in the first example was performed for 40 min for each of a heavily-doped p-type Si substrate and a heavily-doped n-type Si substrate. Thereafter, as one form of the treatment of the present invention, a W metal film was formed on each substrate by CVD using $WF_6$ as a source gas. The CVD conditions were such that the $WF_6$ gas flow rate is 10 sccm, the hydrogen flow rate was 1,000 sccm, the pressure was 0.1

Torr, the substrate temperature was 150° C., and the growth time was 60 sec.

As a result of the formation of this tungsten layer, a consumption of $3 \times 10^{-8}$ m of the underlying substrate was found in the heavily-doped p-type Si substrate, and a consumption of $5 \times 10^{-8}$ m of the underlying substrate was found in the heavily-doped n-type Si substrate.

In a conventional method by which a tungsten layer was formed under the same conditions as above on each of heavily-doped p- and n-type Si substrates not irradiated with plasma, a consumption of $2.5 \times 10^{-8}$ of the underlying substrate was found in the heavily-doped p-type substrate, and a consumption of $1 \times 10^{-7}$ m of the underlying substrate was found in the heavily-doped n-type substrate. Note that the consumption was $4 \times 10^{-8}$ m in a lightly-doped substrate under the same conditions.

In the above conventional method, therefore, the rate of consumption for p-type substrates differed from that for n-type substrates. However, in this example, it was possible to reduce the difference in the consumption rate between heavily-doped p- and n-type substrates by making the processing characteristics of the heavily-doped substrates analogous to those of lightly-doped substrates by the electrical deactivation using plasma irradiation. Especially, in a heavily-doped n-type substrate, the consumption rate could be decreased to a value extremely close to that of a lightly-doped substrate.

In addition, when annealing was performed at 550° to 600° C. for 20 min after the formation of the tungsten layer, it was possible to return the carrier concentration and the mobility of the heavily-doped layer to their respective values before the deactivation treatment using plasma irradiation.

In the case of B-doped poly Si, the consumption volume of Si caused by $WF_6$ gas started decreasing gradually when the carrier concentration exceeded $5 \times 10^{18}/cm^3$ and kept decreasing monotonously until the carrier concentration was near $3 \times 10^{20}/cm^3$ which was the upper limit by which doping was possible.

In the case of As-doped poly Si, on the other hand, the consumption volume of Si caused by $WF_6$ gas started increasing gradually when the carrier concentration exceeded $5 \times 10^{18}/cm^3$ and kept increasing monotonously until the carrier concentration was near $3 \times 10^{20}/cm^3$ which was the upper limit by which doping was possible.

For this reason, the improvement in the Si consumption volume in this example was found in a broad range of the carrier concentration from $5 \times 10^{18}$ to $3 \times 10^{20}/cm^3$.

Example 4

Example 4 will be described below as a semiconductor substrate treatment method according to another embodiment of the present invention, in which the present invention was applied to formation of a conductive layer on a heavily-doped semiconductor substrate.

Figure 2B:
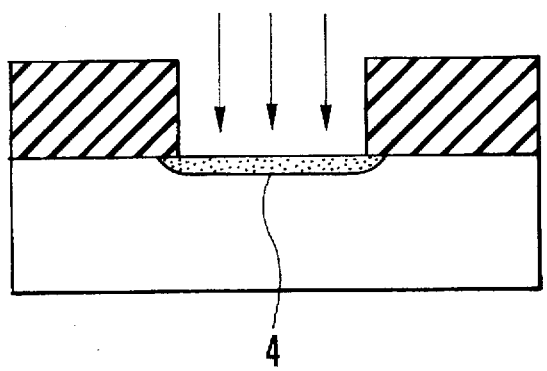
Figure 2C:
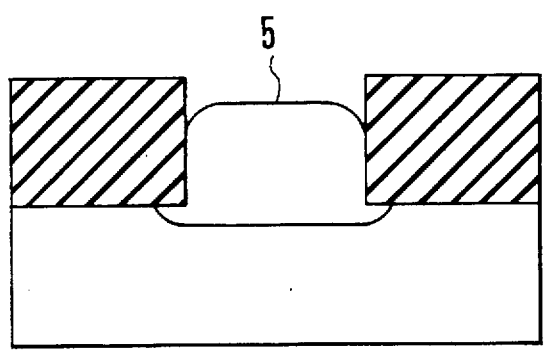

FIGS. 2A to 2C are sectional views of fabrication steps showing a conductive layer formation method as the semiconductor substrate treatment method of this example. In FIGS. 2A to 2C, reference numeral 1 denotes a heavily-doped Si diffused layer formed on a substrate (not shown); 2, a dielectric layer made from, e.g., $SiO_2$; 3, a hole formed in the dielectric layer 2; 4, a deactivated layer formed on the Si diffused layer 1 by irradiation of hydrogen plasma; and 5, a tungsten layer formed on a portion of the Si diffused layer 2 in the hole 3.

First, as shown in FIG. 2A, the dielectric layer 2 constructed from, e.g., $SiO_2$ was formed on the heavily-doped Si diffused layer 1 formed on the substrate, and pattern exposure and development were performed. Thereafter, the hole 3 was formed by anisotropic etching. Note that the substrate on which the Si diffused layer 1 is formed is an n-type substrate if the diffused layer 1 is of a p-type, and a p-type substrate if the diffused layer 1 is of an n-type.

Subsequently, a gas mixture of hydrogen and nitrogen was introduced onto the substrate, and hydrogen plasma was formed by applying RF power. In this manner, the deactivated layer 4 was formed near the surface of the heavily-doped Si diffused layer 1 on the bottom of the hole 3 (FIG. 2B).

This deactivation was possible when the substrate temperature was 0° to 170° C., the hydrogen flow rate was 100 to 5,000 sccm, the nitrogen flow rate was 0 to 100 sccm, the internal pressure of the reaction chamber was 0.01 to 2 Torr, and the RF power was 30 to 1,000 W. Additionally, in order that the dopant on the surface of the heavily-doped Si diffused layer 1 was sufficiently deactivated, the treatment time needed to be increased or decreased in accordance with the doping level of the heavily-doped Si diffused layer 1, the type of dopant, the gas conditions, and the RF application method.

The conditions employed in this example were such that the substrate temperature was 23° C., the hydrogen flow rate was 2,000 sccm, the nitrogen flow rate was 6 sccm, the internal pressure of the reaction chamber was 0.4 Torr, the applied RF power was 150 W, the RF application method was of cathode coupling mode, and the treatment time was 60 sec. To obtain an identical effect, an anode coupling mode required an approximately tenfold treatment time.

In addition, as in the previous examples, nitrogen gas was added to discourage etching of the heavily-doped Si diffused layer 1 occurring simultaneously with the deactivation. Therefore, no nitrogen gas need be added if etching to a certain extent is allowable.

Subsequently, cleaning was performed, as one form of the treatment of the present invention, for the substrate in a 0.5% diluted HF solution for 20 sec. Although the diluted HF solution was used in this example, this cleaning was a treatment for obtaining a cleaned surface. Therefore, a similar effect can be obtained by using a buffered diluted HF solution or a BHF solution with a surface active agent.

It is also possible to obtain cleaned substrate surfaces by dry etching using plasma formed by various reaction gases such as Ar, $H_2$, $CF_4$, $C_3F_8$, $CCl_4$, and $BCl_3$, sputtering, or ion beam.

Finally, as shown in FIG. 2C, the tungsten layer 5 was formed on the bottom of the hole 3 of the substrate in accordance with selective growth using the $SiH_4$ reduction method, as one form of the treatment of the present invention. To form this tungsten layer 5, the substrate was heated to a predetermined temperature, and, if a carrier gas (e.g., $H_2$, $N_2$, or an inert gas) was to be used, this gas was introduced into the reaction chamber, and $SiH_4$ and $WF_6$ were introduced in this order. Note that selective growth is possible without using any carrier gas.

This selective growth was possible in the substrate temperature range of 200° to 350° C. Also, selective growth of s-phase W was possible when the flow rate ratio of $SiH_4$ to $WF_6$ was 1:2±0.6, and the selective growth was possible in the total pressure range of 0.01 to 1 Torr.

The conditions used in this example were such that the substrate temperature was 300° C., the carrier gas flow rates of hydrogen, $WF_6$, and $SiH_4$ were 500, 10, and 5 sccm, respectively, and W was grown for 60 seconds by introducing $WF_6$ into the reaction chamber two seconds after $SiH_4$ was introduced.

Since the clean Si surface was already obtained by the deactivation treatment and the diluted hydrofluoric acid treatment, FIG. 2B, it was unnecessary to perform self-cleaning using the Si reduction method that was conventionally used. Consequently, low-resistance ohmic contacts were formed at a high yield only by a slight self-cleaning action resulting from the $SiH_4$ reduction method.

Figure 3A:
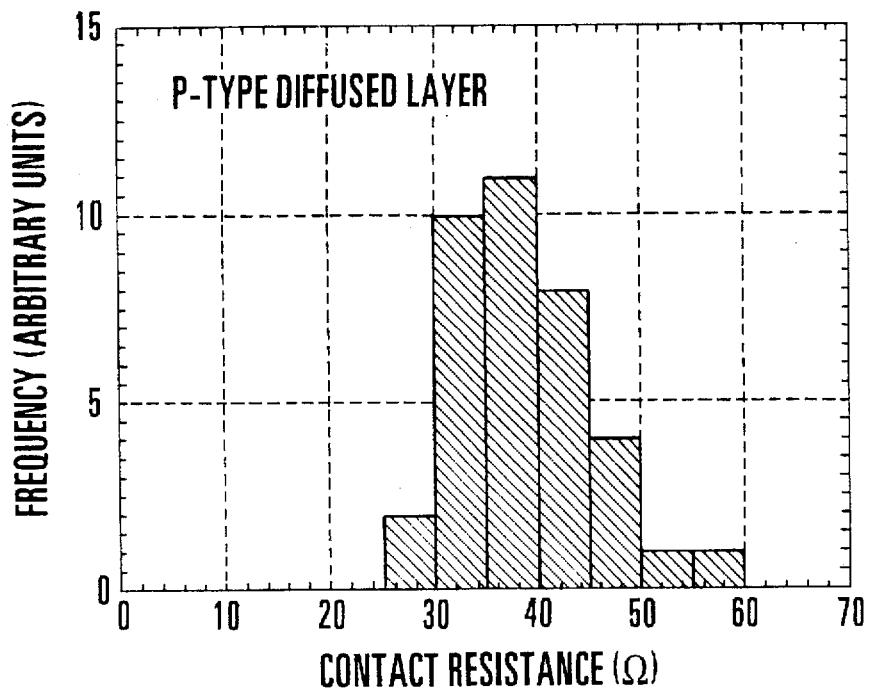
FIGS. 3A and 3B are graphs each showing the histogram of the contact resistance of a metal contact formed on a heavily-doped Si diffused layer by the semiconductor substrate treatment method in FIGS. 2A to 2C.
Figure 3B:
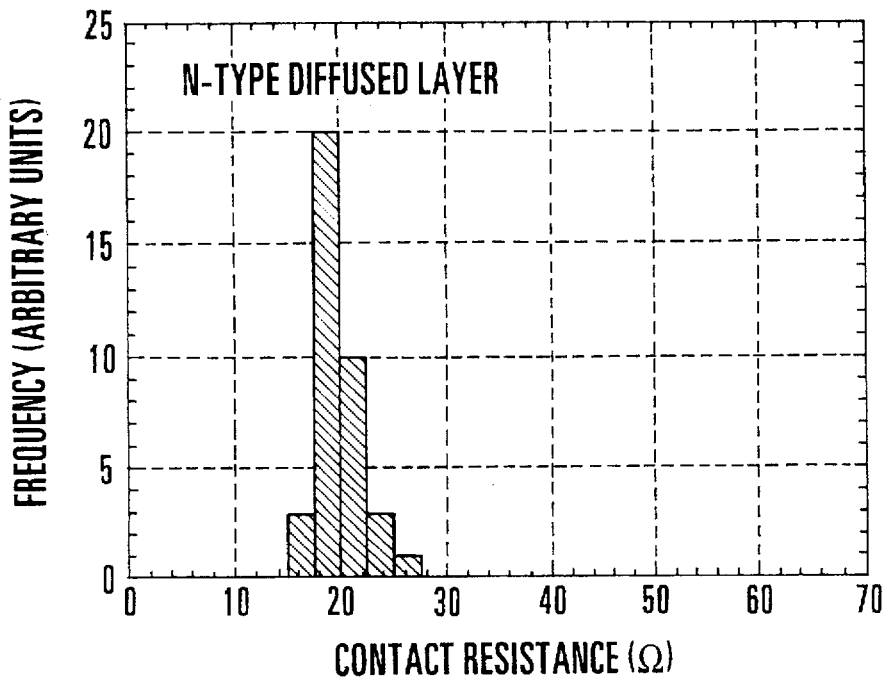

FIG. 3A is a graph showing the histogram of the contact resistance of a metal contact formed on a heavily-doped p-type Si diffused layer by the conductive layer formation method of this example. FIG. 3B is a graph showing the histogram of the contact resistance of a metal contact similarly formed on a heavily-doped n-type Si diffused layer. In each of FIGS. 3A and 3B, the frequency on the ordinate is plotted in normalized arbitrary units.

The contact diameter was 0.85 μm, and the contact resistivity was 0.3 $\mu\Omega.cm^2$ for the heavily-doped p-type substrate in FIG. 3A, and 0.1 $\mu\Omega.cm^2$ for the heavily-doped n-type substrate in FIG. 3B.

On the other hand, when W growth using the $SiH_4$ reduction method was done without using the deactivation treatment of this example, an approximately tenfold contact resistivity resulted in a heavily-doped p-type. substrate. Additionally, tungsten peeled from the heavily-doped p-type substrate in many cases.

In this manner, it was possible to improve the contact characteristics and the adhesion between tungsten and the semiconductor substrate.

Also, since the $SiH_4$ reduction method in which Si consumption was small was used, the Si consumption amount was as small as $1.2 \times 10^{-8}$ m in the heavily-doped n-type substrate and $1.4 \times 10^{-8}$ m in the heavily-doped p-type substrate. As a result, a leakage current flowing through the junction between the heavily-doped Si diffused layer 1 and the underlying lightly-doped Si substrate was not at all increased from the leakage current that the junction originally had.

In this example, most of the deactivated layer 4 was lost by Si consumption. In addition, since the residual deactivated later 4 was heated to 200° C. or higher in growing the tungsten layer 5, the dopant was reactivated without providing any special annealing step. However, the dopant is reactivated more completely by providing a special annealing step at a higher temperature than the growth temperature of tungsten. This improves the adhesion between tungsten and Si, thereby further improving the contact characteristics. In effect, when annealing was carried out after the growth of tungsten, the contact resistance decreased inversely proportional to the annealing temperature until 550° C.

In this example, no self-cleaning using the Si reduction method was done before the growth of W using the $SiH_4$ reduction method. However, the Si reduction method can be performed as in conventional methods if Si consumption to some extent is permissible.

In addition, fluorine was used as the W halide gas in this example. However, an analogous selective growth is possible by use of chlorine (that is, $WCl_6$) instead of fluorine. The reducing gas is not also restricted to $SiH_4$. That is, a similar effect can be achieved by any one of $H_2$, $Si_2H_6$, $Si_3H_8$, $GeH_4$, $Ge(CH_3)_2H_2$, $Ge(C_2H_5)_2H_2$, $B_2H_6$, and $AsH_3$, which is reducible to $WF_6$ or $WC_{16}$.

Note that the improvement in the contact characteristics obtained by this example was derived from cleaning of the Si, surface before a refractory metal was deposited, so this improvement was found only when the effect of cleaning the underlying Si substrate surface was obtained. Therefore, as described above in Examples 1 and 2, good contact characteristics were obtained in the carrier concentration range within which the hydrofluoric acid-based wet treatment characteristics or the dry etching characteristics were improved (i.e., $3 \times 10^{18}$ to $3 \times 10^{20}/cm^3$ for the former characteristics, and $1 \times 10^{18}$ to $3 \times 10^{20}/cm^3$ for the latter characteristics).

It is also evident from the above derivation that a similar effect can be obtained by growing another type of refractory metal.

Example 5

Example 5 will be described below as a semiconductor substrate treatment method according to still another embodiment of the present invention, in which the present invention was applied to formation of a conductive layer on a heavily-doped semiconductor substrate.

FIGS. 4A to 4D are sectional views of fabrication steps showing a conductive layer formation method as the semiconductor substrate treatment method of this example. In FIGS. 4A to 4D, the same reference numerals as in FIGS. 2A and 2B denote the same parts. In FIGS. 4A to 4D, reference numeral 6 denotes a Ti layer formed on an Si diffused layer 1 in a hole 3; 7, a TiN layer formed on top of the Ti layer 6; and 8, a tungsten layer formed on top of the TiN layer 7.

Figure 4A:
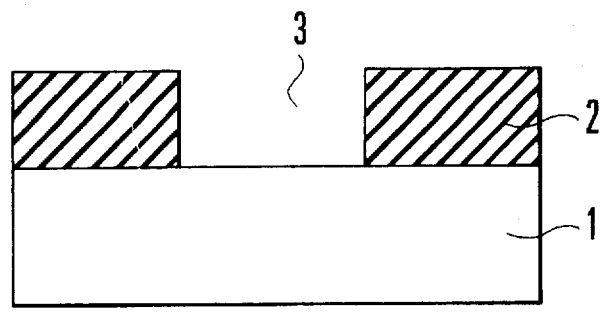
FIGS. 4A to 4D are sectional views showing a conductive layer formation method as a semiconductor substrate treatment method according to still another embodiment of the present invention.
Figure 4B:
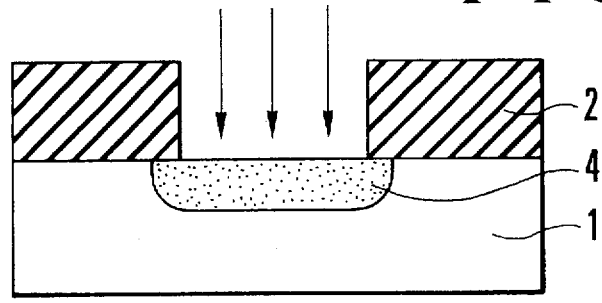

First, as shown in FIG. 4A, a dielectric layer 2 made from, e.g., $SiO_2$ was formed on the heavily-doped Si diffused layer 1 formed on a substrate, and pattern exposure and development were performed. Thereafter, the hole 3 was formed by anisotropic etching. Subsequently, a gas mixture of hydrogen and nitrogen was introduced onto the substrate, and hydrogen plasma was formed by applying RF power. In this manner, a deactivated layer 4 was formed near the surface of the heavily-doped Si diffused layer on the bottom of the hole 3 (FIG. 4B).

In this example, the deactivation conditions were such that the substrate temperature was 100° C., the hydrogen flow rate was 2,000 sccm, the nitrogen flow rate was 6 sccm, the internal pressure of the reaction chamber was 0.5 Torr, the applied RF power was 200 W, and the treatment time was 10 min. By this deactivation treatment, about 70% of the dopant inside the heavily-doped Si diffused layer 1 was deactivated in a p-type substrate, and about 50% of the dopant was deactivated in the case of an n-type substrate. Since the deactivation proceeded from the surface, it is estimated that the deactivation proceeded further on the uppermost surface of the heavily-doped Si diffused layer 1. However, an accurate value was unknown.

As in the previous examples, the addition of nitrogen gas was to suppress the etching of the heavily-doped Si diffused layer 1 taking place simultaneously with the, deactivation. Therefore, nitrogen gas need not be added in situations where etching to a certain degree is permissible. When no nitrogen was added under the above deactivation conditions, the heavily-doped Si diffused layer 1 was etched at a rate of $1 \times 10^{-8}$ m/min. On the other hand, when nitrogen was added, the etching rate became $4 \times 10^{-12}$ m/min or lower, and this made it possible to suppress the etching of the heavily-doped Si diffused layer 1.

Figure 4C:
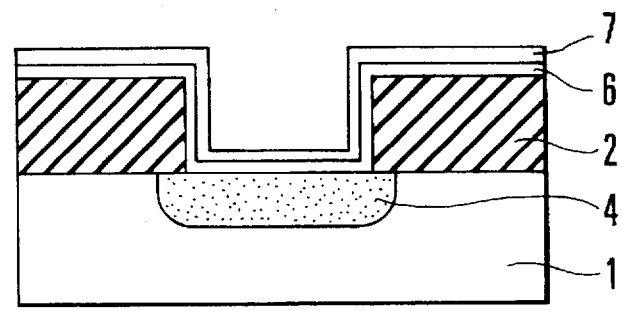

Subsequently, as one form of the treatment of the present invention, the resultant substrate was cleaned in a 0.5% diluted HF solution. Thereafter, the Ti layer 6 and the TiN layer 7 were formed in the hole 3 by sputtering (FIG. 4C).

Figure 4D:
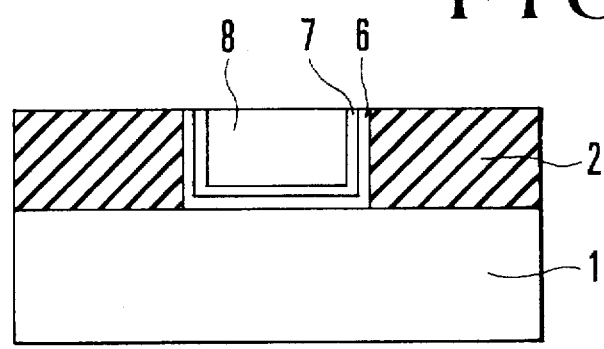

Subsequently, as another form of the treatment of the present invention, the tungsten layer 8 was grown to bury the hole 3 by CVD, thereby forming a metal contact (FIG. 4D).

After the formation of this metal contact, annealing for reactivating the deactivated dopant is necessary. However, in this example, no special annealing for reactivation of the dopant need be performed, since the reactivation was performed in the growth of the tungsten layer 8 by the CVD process while the substrate was heated to 450° C.

This example made use of the diluted HF solution. Since, however, this cleaning is a treatment for obtaining a cleaned surface, a similar effect can, of course, be obtained by using a buffered diluted HF solution or a BHF solution with a surface active agent. It is also possible to obtain a cleaned substrate Surface by dry etching using plasma formed by various reaction gases such as Ar, $H_2$, $CF_4$, $C_3F_8$, $CCl_4$, and $BCl_3$, sputtering, or ion beam.

Figure 5:
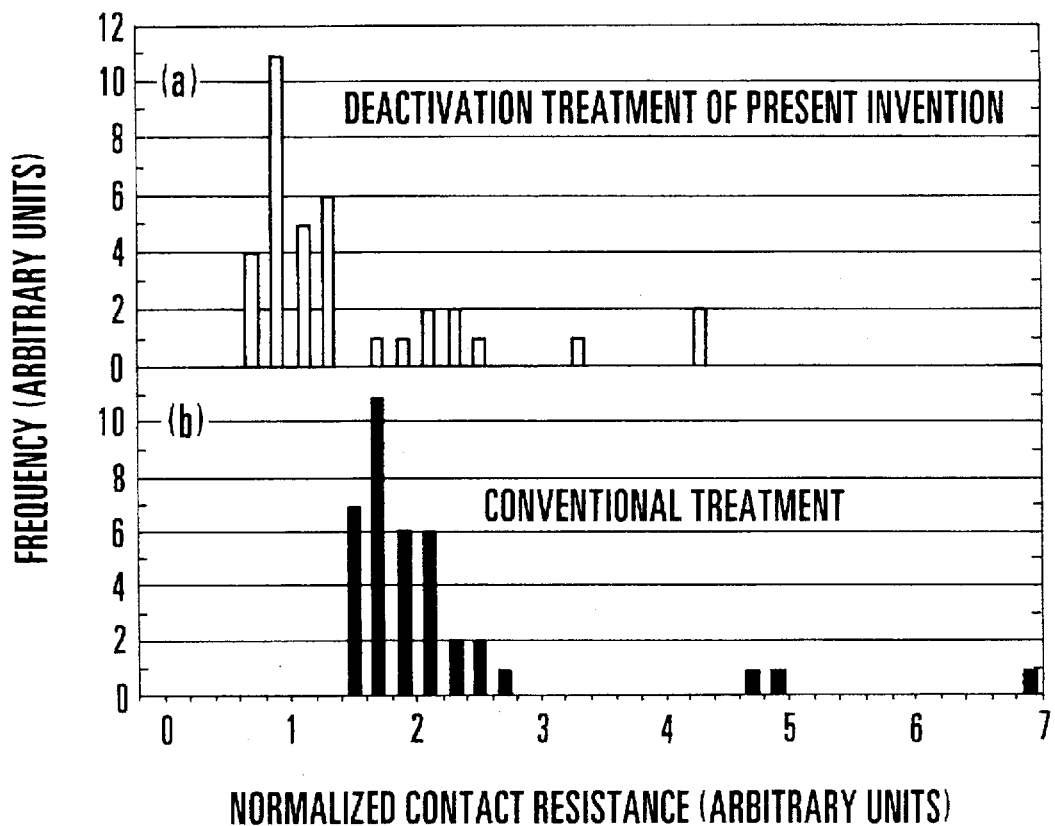
FIG. 5 is a graph showing the histograms of the contact resistances of metal contacts formed on p-type heavily-doped Si diffused layers by the semiconductor substrate treatment method in FIGS. 4A to 4D and by a conventional treatment method.

(a) in FIG. 5 is a graph showing the histogram of the contact resistance of a metal contact formed on a p-type heavily-doped Si diffused layer by the conductive layer formation method of this example. (b) in FIG. 5 is a graph showing the histogram of the contact resistance of a metal contact formed by a conventional conductive layer formation method. The contact diameter was 0.4 μm, and both the frequency on the ordinate and the contact resistance on the abscissa are plotted in normalized arbitrary units.

Note that the conventional treatment process illustrated in (b) of FIG. 5 was exactly the same as that of this example except for the deactivation step.

With the deactivation treatment step of this example, it was possible to decrease the contact resistance by about $_{50}$% on the average and to decrease the variation in resistance by about $_{30}$% as a standard deviation, in comparison to those in the conventional process.

Figure 6:
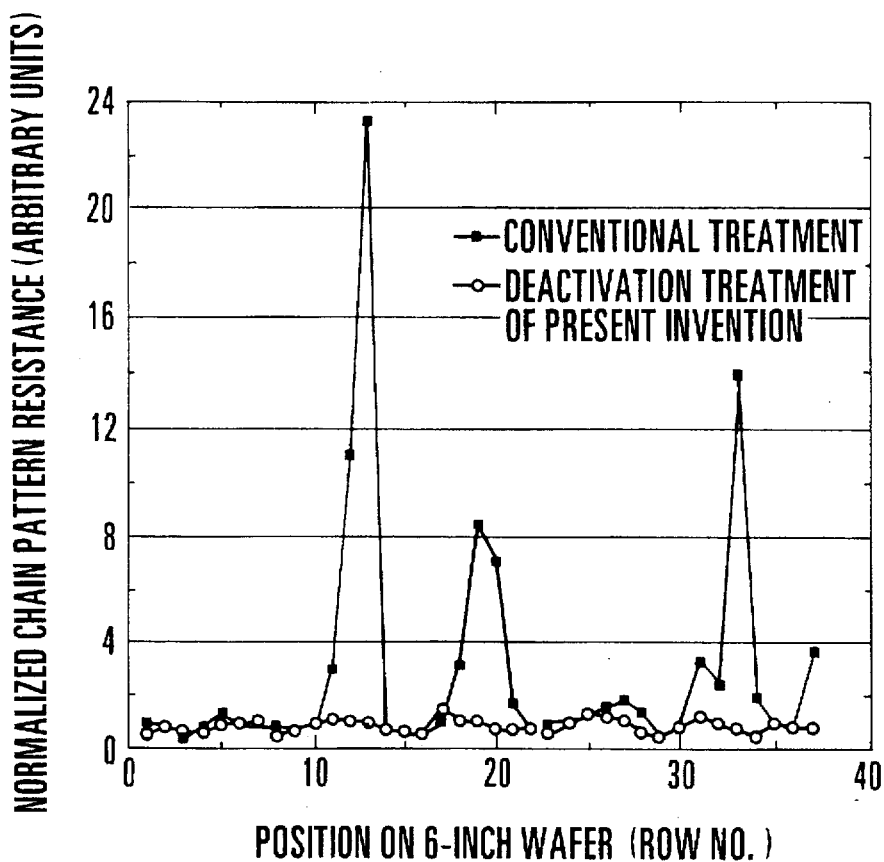
FIG. 6 is a graph showing the dependencies which the chain pattern resistances of metal contacts formed on p-type heavily-doped Si diffused layers by the semiconductor substrate, treatment method in FIGS. 4A to 4D and by a conventional treatment method have on the positions on a wafer.
Figure 7A:
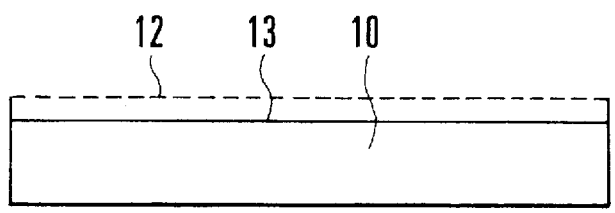
FIGS. 7A and 7B are sectional views showing etching of an underlying substrate caused by conventional hydrogen plasma irradiation.
Figure 7B:
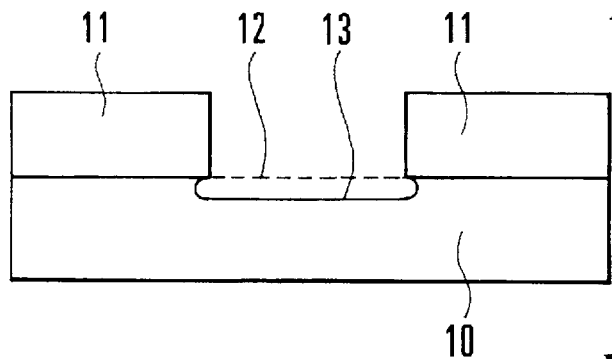

FIG. 6 is a graph showing the relationship between the chain pattern resistance and the chip position on a 6-inch wafer of 12,000 contacts 0.4 μm in diameter. The chain pattern resistance on the ordinate is plotted in normalized arbitrary units.

FIG. 6 shows that the deactivation treatment step of this example made it possible to obtain a stable contact resistance on the entire wafer in comparison to the conventional process.

Likewise, a 10% decrease in the contact resistance and a 15% decrease in the standard deviation were attained in a heavily-doped n-type Si diffused layer. It is considered that the effect was small compared to that of the p-type diffused layer because the cleaning characteristics of the n-type diffused layer with respect to a hydrofluoric acid-based solution were originally better than those of the p-type diffused layer, so there was no large room for improvement.

In addition, the use of this method brought about no increase in the leakage current from the diffused layer into the substrate in comparison to the conventional method. This indicates that irradiation damage which the diffused layer was given by hydrogen plasma was exceptionally small.

The improvement in the contact characteristics obtained by this method is derived from the method of cleaning the Si surface before deposition of a refractory metal. Therefore, it is, of course, possible to obtain an analogous effect in deposition of a refractory metal (e.g., tungsten or molybdenum) performed by sputtering or CVD.

Since the improvement in the contact characteristics obtained by this example was derived from the cleaning of the Si surface before deposition of a refractory metal, this improvement was found only when the effect of cleaning the surface of the underlying Si substrate was obtained. As described earlier in Examples 1 and 2, therefore, good contact characteristics were obtained in the carrier concentration range within which the hydrofluoric acid-based wet treatment characteristics or the dry etching characteristics were improved (i.e., $3 \times 10^{18}$ to $3 \times 10^{20}$/cm$^3$ for the former characteristics, and $1 \times 10^{18}$ to $3 \times 10^{20}$/cm$^3$ for the latter characteristics).

Example 6

In Examples 4 and 5 described above, the semiconductor substrate was deactivated by forming the hole 3 in the dielectric layer 2. It is also possible to perform the deactivation through the dielectric layer 2 without forming any hole. This is so because hydrogen atoms diffuse a long distance at room temperature in a silicon oxide film or in a silicon nitride film normally used as a dielectric layer. That is, even if a dielectric layer is formed, some hydrogen atoms reach the semiconductor substrate below the dielectric layer.

In this example, it was possible to obtain effects similar to those of Examples 4 and 5 by performing the treatments of the present invention, such as formation of a hole, cleaning, and formation of a conductive layer, after the deactivation as described above.

Example 7

As a semiconductor substrate treatment method according to still another embodiment of the present invention, a method of suppressing etching of a semiconductor substrate occurring simultaneously with deactivation will be described in Example 7 below.

Deactivation of this example was accomplished by exposing an Si substrate to plasma of a gas mixture of $H_2$ and $N_2$. The deactivation conditions were such that the substrate temperature was 120° C. the hydrogen flow rate was 2,000 sccm, the nitrogen flow rate was 6 sccm, the internal pressure of the reaction chamber was 0.5 Torr, and the applied RF power was 200 W.

The etching depth of the Si substrate after this plasma irradiation was done for 12 hours was less than $2.5 \times 10^{-9}$ m. That is, the etching rate was $4 \times 10^{-12}$ m/min or lower.

On the other hand, the etching rate was $9 \times 10^{-9}$ m/min in a conventional method by which an Si substrate was exposed to pure hydrogen plasma under the conditions that the substrate temperature was 120° C., the hydrogen flow rate was 2,000 sccm, the internal pressure of the reaction chamber was 0.5 Torr, and the applied RF power was 200 W.

The etching rate of this example, therefore, was ½,000 or smaller the etching rate in the conventional method. This value can be neglected in practice.

It is readily understood that the etching of the substrate can be discouraged without decreasing the efficiency of the electrical deactivation, since the efficiency of the deactivation is the same as in the conventional method using only hydrogen plasma.

Note that the general relationship between the hydrogen flow rate and the nitrogen flow rate is that the deactivation efficiency and the etching rate rise with an increase in hydrogen flow rate, and the etching suppressing effect becomes large with an increase in nitrogen flow rate.

Although the mixture of $N_2$ gas and $H_2$ gas was used in this example, a similar effect can be obtained by use of $NH_3$ gas instead of $N_2$ gas. It is also possible to use $NH_3$ gas alone without using $H_2$ gas.

The underlying substrate etching suppressing effect resulting from the addition of $N_2$ gas or $NH_3$ gas was obtained when the substrate temperature was 23° to 350° C., the hydrogen flow rate was 200 to 2,000 sccm, the nitrogen flow rate was 1 to 40 sccm, the internal pressure of the reaction chamber was 0.1 to 2 Torr, and the carrier concentration of the semiconductor substrate was $1\times10^{14}$ to $3\times10^{20}$/ $cm^3$ for both p- and n-type substrates.

Note that the principle of the etching suppression as described above is not necessarily obvious. It is, however, estimated that a thin nitride film is formed on a substrate by the action of nitrogen radicals, and this inhibits etching of the underlying substrate caused by hydrogen plasma.

Oxygen is also a gas which suppresses etching of Si. Unfortunately, the Si etching rate upon addition of oxygen cannot be $4\times10^{-10}$ m/min or lower even if the addition amount of oxygen is increased, so the suppressing effect of oxygen is inferior to that of nitrogen. However, oxygen has an advantage in that the surface after plasma irradiation is covered with an oxide film, so this surface is extremely stable in air compared to the case in which nitrogen is added. Oxygen can also be used in situations where mixing of nitrogen into Si is a problem, e.g., when nitrogen is activated as an impurity to bring about the problem of a doping effect.

Example 8

In the above example, the present invention was applied to an Si substrate. However, in a semiconductor substrate treatment method according to still another embodiment of the present invention, deactivation is similarly applicable to poly Si, GaAs, and InP in Example 8.

As in Example 7, in the case of a poly Si, GaAs, or InP substrate, the etching depth after plasma irradiation was performed for 12 hours by using a gas mixture of $H_2$ and $N_2$ was less than $2.5\times10^{-9}$ m.

Also, the semiconductor substrate etching suppressing effect was obtained when the substrate temperature was 23° to 350° C., the hydrogen flow rate was 200 to 2,000 sccm, the nitrogen flow rate was 1 to 40 sccm, and the internal pressure of the reaction chamber was 0.1 to 2 Torr.

Example 8 is also the same as Example 7 in that an electrical deactivation efficiency equivalent to that obtained by the conventional method using hydrogen plasma alone can be obtained. $NH_3$ gas can be used in place of $N_2$, $NH_3$ can be used singly, and oxygen can also be used.

Note that it is naturally possible to apply the etching suppressing methods of Examples 7 and 8 to Examples 1 to 6 described previously.

According to the present invention, a semiconductor substrate is cleaned after the effective doping level of the substrate is decreased by performing electrical deactivation by which the substrate is exposed to plasma formed by exciting a gas containing hydrogen atoms. Therefore, it is possible to reduce the difference in the cleaning characteristics between heavily-doped p- and n-type substrates and to make the characteristics analogous to those of lightly-doped substrates. With this improvement, in the cleaning characteristics, an extremely clean substrate surface can be obtained. Additionally, by heating the semiconductor substrate subjected to the cleaning treatment, reactivation can be performed in which the carrier concentration and the mobility of the substrate are returned to their respective values before the deactivation treatment.

Since the cleaning and the formation of a conductive layer are performed after the effective doping level of a substrate is decreased by the electrical deactivation, a clean substrate surface is realized by an improvement in the cleaning characteristics. Consequently, a low-resistance, high-performance contact can be formed between the conductive layer and the semiconductor substrate at the interface between which enclosure is little.

Also, the cleaning and the formation of a conductive surface are performed after a hole is formed in a dielectric layer and the effective doping level of a substrate is decreased by the electrical deactivation. This realizes a clean substrate surface resulting from an improvement in the cleaning characteristics. As a result, a low-resistance, high-performance contact between the conductive layer and the semiconductor substrate at the interface where enclosure or inclusion is little can be formed on the surface of the substrate in the hole.

It is also possible to electrically deactivate a semiconductor substrate below a dielectric layer by exposing the substrate to plasma, prior to forming a hole in the dielectric layer. With treatments such as the formation of a hole, the cleaning, and the formation of a conductive layer performed after the deactivation, a low-resistance, high-performance contact between the conductive layer and the semiconductor substrate at the interface where enclosure is little can be formed on the substrate surface in the hole.

Performing a heat treatment after the cleaning step or after the conductive layer formation step makes feasible reactivation by which the carrier concentration and the mobility of a substrate are returned to their respective values before the deactivation treatment.

A semiconductor substrate can be readily cleaned by cleaning the substrate with a solution containing hydrofluoric acid. The result is a exceptionally clean substrate surface. Also, it is possible by the electrical deactivation to decrease the difference in the cleaning characteristics between heavily-doped p- and n-type substrates and to make the characteristics close to those of lightly-doped substrates. Consequently, the number of steps required for the processing can be decreased, and this makes stable processing with a large process margin possible.

A semiconductor substrate can be easily cleaned by performing dry etching on the substrate surface by using plasma, sputtering, or ion beam. Also, the difference in the etching characteristics between heavily-doped p- and n-type substrates can be decreased by the electrical deactivation. This makes it possible to decrease the number of steps required for the processing, resulting in stable processing with a large process margin.

Furthermore, cleaning as one form of the treatment of the present invention is performed for a deactivated semiconductor substrate, and then a conductive layer is formed by CVD using a gas containing a compound of a metal and a halogen element. Therefore, in a reduction method such as a silicon reduction method in which the semiconductor substrate material is used as a reducing agent, it is possible to decrease the difference in the consumption rate between heavily-doped p- and n-type substrates and to make the value of the consumption volume in the resultant semiconductor substrate close to that in a lightly-doped substrate. The result is stable processing with a large process margin. Additionally, a clean substrate surface can be realized by an improvement in the cleaning characteristics. Consequently, good contact characteristics can be attained only with a reduction method such as a silane reduction method by which the semiconductor substrate material is not used as a reducing agent.

A tungsten layer is formed by CVD using a gas containing a compound of tungsten and a halogen element. Therefore, in a reduction method such as a silicon reduction method in which the semiconductor substrate material is used as a reducing agent, it is possible to decrease the difference in the consumption rate between heavily-doped p- and n-type substrates and to make the consumption value in the resultant semiconductor substrate close to that in a lightly-doped substrate. Additionally, since a clean substrate surface can be realized, a good contact can be formed between tungsten and the substrate surface only with a reduction method such as a silane reduction method by which the semiconductor substrate material is not used as a reducing agent.

After a deactivated semiconductor substrate is cleaned, a titanium layer is formed by sputtering. Therefore, a clean substrate surface is realized by an improvement in the cleaning characteristics. The result is that a low-resistance, high-performance contact can be formed between the titanium layer and the semiconductor substrate at the interface where enclosure or inclusion is little.

Electrical deactivation is done by exposing a semiconductor substrate to a plasma atmosphere in which a gas containing hydrogen and oxygen atoms is excited. Consequently, it is possible to discourage etching of the substrate without decreasing the efficiency of the deactivation.

Electrical deactivation is performed by using a plasma atmosphere in which a gas mixture of hydrogen and nitrogen gases is excited. Consequently, etching of the substrate can be suppressed, and the flow rates of the hydrogen and the nitrogen gases can be adjusted independently of each other. This makes it possible to adjust the deactivation efficiency and the etching suppressing effect independently of each other.

Electrical deactivation is done by exposing a semiconductor substrate, to a plasma atmosphere in which a gas containing hydrogen and oxygen atoms is excited. Therefore, etching of the substrate can be discouraged without decreasing the efficiency of the deactivation.

Electrical deactivation is performed by using a plasma atmosphere in which a gas mixture of hydrogen and oxygen gases is excited. Consequently, etching of the substrate can be suppressed, and the flow rates of the hydrogen and the oxygen gases can be adjusted independently of each other. This makes it possible to adjust the deactivation efficiency and the etching suppressing effect independently of each other.

Moreover, electrical deactivation is accomplished by exposing a semiconductor substrate to a plasma atmosphere in which ammonia gas is excited. Therefore, etching of the substrate can be discouraged without decreasing the deactivation efficiency, and this allows electrical deactivation by use of a single gas. Consequently, the apparatus used for the deactivation can be simplified.

What is claimed is:

1. A semiconductor substrate treatment method comprising the steps of:

in one of a silicon semiconductor substrate and a polysilicon semiconductor substrate, said substrate having a top surface, wherein said substrate is doped, electrically deactivating a portion of a dopant of said semiconductor substrate by exposing said semiconductor substrate to a plasma atmosphere in which a gas containing at least hydrogen atoms is excited;

after the step of electrically deactivating a portion of said dopant, treating said substrate surface, wherein said step of treating said substrate surface includes one of the steps of cleaning said substrate surface, etching said substrate surface, and forming a conductive layer on said substrate surface; and electrically activating said dopant by heating said substrate.

2. The method of claim 1, further comprising the steps of forming a dielectric layer on said semiconductor substrate and patterning said dielectric layer to form a hole, in which said semiconductor substrate is exposed, in a portion of said dielectric layer, wherein the deactivating step is performed after the hole formation step.

3. The method of claim 1, further comprising the steps of:

forming a dielectric layer on said semiconductor substrate; and patterning said dielectric layer to form a hole, in which said semiconductor substrate is exposed, in a portion of said dielectric layer, and wherein said deactivating step is performed between said dielectric layer forming step and said hole forming step, and said treatment step is performed after said hole forming step.

4. The method of claim 1, wherein the step of cleaning said substrate surface includes cleaning said semiconductor substrate surface with a solution containing hydrofluoric acid.

5. The method of claim 1, wherein the etching step of said substrate surface is a dry etching step.

6. The method of claim 1, wherein the step of forming a conductive layer on substrate surface includes forming a conductive layer on a substrate surface by chemical vapor deposition using a gas containing at least a compound of a metal and a halogen element.

7. The method of claim 6, wherein said metal is tungsten and said conductive layer formed on said substrate surface is a tungsten layer.

8. The method of claim 1, wherein the step of forming a conductive layer on said substrate surface includes forming a titanium layer by sputtering.

9. The method of claim 1, wherein the step of deactivating a portion of said dopant of said semiconductor substrate includes exposing said semiconductor substrate to a plasma atmosphere formed by exciting an atmosphere containing at least nitrogen atoms in addition to hydrogen atoms.

10. The method of claim 1, wherein the step of deactivating a portion of said semiconductor substrate includes exposing said semiconductor substrate to a plasma atmosphere formed by exciting an atmosphere containing at least oxygen atoms in addition to hydrogen atoms.

11. A semiconductor substrate treatment method comprising:

in one of a silicon semiconductor substrate and a polysilicon semiconductor substrate having a surface, wherein said substrate is doped, forming a dielectric layer on said semiconductor substrate surface and patterning said dielectric layer to form a hole, in which said semiconductor substrate is exposed, in a portion of said dielectric layer;

electrically deactivating a portion of a dopant of said exposed substrate by exposing said semiconductor substrate surface to a plasma atmosphere in which a gas containing at least hydrogen atoms is excited;

cleaning said substrate surface; and forming a conductive layer on said exposed substrate surface.

12. A semiconductor substrate treatment method comprising the steps of:

forming a dielectric layer on a semiconductor substrate;

deactivating a substrate surface below said dielectric layer by exposing said semiconductor substrate to a plasma atmosphere in which a gas containing at least hydrogen atoms is excited;

patterning said dielectric layer to form a hole, in which a surface of said semiconductor substrate is exposed, in a portion of said dielectric layer;

cleaning said exposed substrate surface; and forming a conductive film on said exposed substrate surface.

* * * * *